(12) United States Patent  (10) Patent No.: US 8,395,399 B2
Rousseville et al.  (45) Date of Patent: Mar. 12, 2013

(54) SEMICONDUCTOR DEVICE AND WAFER WITH A TEST STRUCTURE AND METHOD FOR ASSESSING ADHESION OF UNDER-BUMP METALLIZATION

(75) Inventors: Lucie Rousseville, Waldolwisheim (FR); Serge Bardy, Caen (FR); Philippe Le Duc, Louvigny (FR); David Desmortreux, May sur Orne (FR)

(73) Assignee: NXP B.V., Eindhoven (NL)

( * ) Notice: Subject to any disclaimer, the term of this patent is extended or adjusted under 35 U.S.C. 154(b) by 311 days.

(21) Appl. No.: 12/746,321

(22) PCT Filed: Dec. 1, 2008

(86) PCT No.: PCT/IB2008/055023
§ 371 (c)(1),
(2), (4) Date: Jun. 4, 2010

(87) PCT Pub. No.: WO2009/072052
PCT Pub. Date: Jun. 11, 2009

(65) Prior Publication Data
US 2010/0253372 A1  Oct. 7, 2010

(30) Foreign Application Priority Data
Dec. 6, 2007 (EP) ..................................... 07291461

(51) Int. Cl.
*G01R 27/08* (2006.01)
(52) U.S. Cl. ....................................................... 324/705
(58) Field of Classification Search ............. 324/762.03, 324/762.05, 719, 765; 438/11, 18
See application file for complete search history.

(56) References Cited

U.S. PATENT DOCUMENTS

| 6,013,952 | A | * | 1/2000 | Chan ............................. 257/773 |
| 6,022,750 | A | * | 2/2000 | Akram et al. ...................... 438/18 |
| 6,144,040 | A | * | 11/2000 | Ashton ............................. 257/48 |
| 6,297,517 | B1 | * | 10/2001 | Matsumoto et al. ............. 257/48 |
| 6,316,839 | B1 | | 11/2001 | Farnworth |
| 6,362,638 | B1 | * | 3/2002 | Ashton et al. ............. 324/762.02 |
| 6,548,881 | B1 | | 4/2003 | Blish et al. |
| 6,790,685 | B2 | * | 9/2004 | Lee .................................. 438/14 |
| 6,943,562 | B2 | * | 9/2005 | Talanov et al. ................. 324/633 |
| 7,078,919 | B2 | * | 7/2006 | Prussin .......................... 324/719 |
| 2006/0019414 | A1 | * | 1/2006 | Wang et al. ..................... 438/14 |

FOREIGN PATENT DOCUMENTS

| EP | 0844658 A2 | 5/1998 |
| GB | 2094552 A | 9/1982 |
| JP | 62 126648 A | 6/1987 |
| JP | 63 228078 A | 9/1988 |
| JP | 05 259248 A | 10/1993 |
| JP | 2003-23022 A | 1/2003 |
| TW | 200743168 A | 5/1995 |

OTHER PUBLICATIONS

International Search Report with Written Opinion for Application PCT/IB2008/055023 (Jun. 11, 2009).

\* cited by examiner

*Primary Examiner* — Melissa Koval
*Assistant Examiner* — Trung Nguyen

(57) ABSTRACT

Semiconductor device with a patterned pad metal layer and a patterned under-bump metallization layer being mutually electrically connected in a common contact area 22. The semiconductor device includes a first test structure 11 for determining a contact resistance between the patterned metallization layer and the patterned pad metal layer in the common contact areas 22. The first test structure includes a pad metal layer portion 24 and a metallization layer portion 18 being in electrical communication with the pad metal layer portion 24 through the common contact area 22. The first test structure 11 further includes connection areas 14, 16 that are electrically connected with each other substantially via the common contact area 22. Upon application of a current between the connection areas 14, 16 a voltage drop occurs that is representative for a voltage drop over the common contact area 22.

12 Claims, 5 Drawing Sheets

SEMICONDUCTOR DEVICE AND WAFER WITH A TEST STRUCTURE AND METHOD FOR ASSESSING ADHESION OF UNDER-BUMP METALLIZATION

FIELD OF THE INVENTION

The invention relates to a semiconductor device being provided with a patterned pad metal layer and a patterned under-bump metallization layer being mutually electrically connected in one or more common contact areas. The invention further relates to a product and to a semiconductor wafer including a semiconductor device according to the invention. The invention further relates to a method for assessing adhesion of a patterned under-bump metallization layer on a patterned pad metal layer of a semiconductor wafer.

BACKGROUND OF THE INVENTION

When mounting a semiconductor device according to the flip-chip method on a substrate, for example a printed circuit board, electrical contact with the substrate is made using solder bumps. These solder bumps are formed on the semiconductor device and are reflowed after placing the semiconductor device on the substrate. The solder bumps are electrically connected with contact pads of an integrated circuit of the semiconductor device.

To promote adhesion of the solder bumps on the semiconductor device, the contact pads are provided with an under-bump metallization. This under-bump metallization also establishes a barrier against diffusion of components of the solder bumps into the pad metal and forms readily wettable surfaces for the solder bumps.

For correct functioning of the semiconductor device, a sufficient adhesion is required of the under-bump metallization on the contact pads. If adhesion is insufficient, the metallization can come loose from the pads as a result of mechanical loading, for example as a result of unintentionally dropping a product that contains the semiconductor device on a floor. If the semiconductor device does not function correctly, a number of process steps, such as the mounting itself, deposition of the solder bumps, and further packaging and assembly steps, may be carried out without benefit giving rise to unnecessary costs. In addition, a product including the semiconductor device can stop functioning correctly with many possible significant disadvantages. To assess adhesion of the under-bump metallization, a shear test is regularly applied using a monitor wafer, for example once in two to five batches a monitor wafer is used. A monitor wafer is also used for example when a change is made in the deposition process of the under-bump metallization, or for example when a change is made to a new type of wafer. The monitor wafer is provided with a relatively thick under-bump metallization layer, being for example three to five times thicker than an under-bump metallization layer on a regular wafer with semiconductor devices. A shear test is then carried out in which a yield strength and a failure mode of the under-bump metallization layer on the monitor wafer is determined.

From the result, the adhesion of the under-bump metallization on the regular wafers processed just before, just after and/or concurrently with the monitor wafer is assessed.

The shear test is destructive and gives an indirect assessment of adhesion of the under-bump metallization so its representativeness for regular wafers is uncertain.

It is an object of the invention to provide a semiconductor device provided with a test structure for assessing adhesion of under-bump metallization.

SUMMARY OF THE INVENTION

The invention provides a semiconductor device including a first test structure for determining a contact resistance between the patterned metallization layer and the patterned pad metal layer in a first one of the common contact areas, the first test structure including a pad metal layer portion being part of the patterned pad metal layer and including a metallization layer portion being part of the patterned under-bump metallization layer and being in electrical communication with the pad metal layer portion through the first one of the common contact areas, the first test structure further including a first and a second connection area that are electrically connected with each other via a first conductive path that extends substantially through the metallization layer portion, via the first one of the common contact areas and through the pad metal layer portion, and including a third and a fourth connection area that are electrically connected with each other substantially via a second conductive path that extends via the first one of the common contact areas, wherein upon application of a current between the first and second connection area a voltage drop between the third and fourth connection area occurs that is representative for a voltage drop over the first one of the common contact areas. In this way a direct assessment of adhesion of the patterned under-bump metallization layer can be obtained for each wafer or for a number of parts of each wafer by determining the contact resistance and comparing it with a predetermined value. This assessment is non-destructive. In this way, using a monitor wafer can be carried out less frequently or can even be omitted. Also, deposition of a thick metallization layer on the monitor wafer can be carried out less frequently or can even be omitted. In addition, carrying out the shear test and observing the failure mode can be carried out less frequently or can even be omitted. Preferably the first and second connection area may be covered by for example a solder bump layer or an isolating layer after measurements using the first test structure are completed.

Preferably, the first and second connection area are electrically connected with each other via the first conductive path that extends substantially via the first one of the common contact areas in such a way that in use of the first test structure more than 50%, in particular more than 80% of the current that flows along the first conductive path flows via the first one of the common contact areas. More preferably, the third and fourth connection area are electrically connected with each other substantially via the second conductive path in such a way that more than 50%, in particular more than 80% of a conductance between the third and fourth connection area is via the second conductive path.

More preferably, the first and second connection area are distinct from the third and fourth connection area. By using this test structure, a contact resistance over the first one of the common contact areas can be determined with relatively high accuracy, for example with the help of a four-point Kelvin measurement. The first one of the common contact areas can for example include only one contact surface between the patterned under-bump metallization layer and the patterned pad metal layer, but can also include a number of distinct contact surfaces between the patterned under-bump metallization layer and the patterned pad metal layer. The first and second conductive path preferable extend through one or more metallic layers and via their mutual contact surfaces exclusively.

In particular, the first and second connection area are electrically connected in such a way that the contact resistance in the first one of the common contact areas and/or a contact resistance in one or more of the other common contact areas influences a voltage measured between the third and fourth connection area to a measurable extent.

The invention further provides a semiconductor wafer including a semiconductor device according to the invention. Such a wafer has the advantage that it can be tested directly, thus improving the reliability of the assessment of adhesion of the patterned under-bump metallization layer on the wafer, and also improving yield of the semiconductor device manufacturing process. It can also prevent the use of a monitor wafer.

Preferably, a test structure included by the semiconductor wafer is positioned on a break- or saw line of the wafer, or near the edge of the wafer, so as to maximize surface of the wafer available for the integrated circuits.

The invention further provides a product including a semiconductor device according to the invention. Such a product can for example be an electrical product, such as for example a mobile phone or a computer, or an automotive product, such as for example a car. The semiconductor device according to the invention will enable improved assessment of the adhesion of a patterned under-bump metallization layer, and as a result enable production of products of improved quality.

It is a further object of the invention to provide an improved method for assessing adhesion of under-bump metallization. The invention provides a method for assessing adhesion of a patterned under-bump metallization layer on a patterned pad metal layer of a semiconductor wafer, the method including electrically determining a contact resistance between a part of the patterned under-bump metallization layer and a part of the patterned pad metal layer, and examining whether the determined contact resistance exceeds a predetermined value. Such a method has the advantage that each wafer can be tested directly, thus improving the reliability of the assessment of adhesion of the patterned under-bump metallization layer on the wafer, and as a result improving yield of the semiconductor device manufacturing process. In this way, using a monitor wafer can be carried out less frequently or can even be omitted. Also, deposition of a thick metallization layer on the monitor wafer can be carried out less frequently or can even be omitted. In addition, carrying out a shear test and observing the failure mode can be carried out less frequently or can even be omitted. An additional advantage of the method according to the invention is that the assessment of adhesion of under-bump metallization is carried out in a non-destructive way.

In particular, the method according to the invention includes determining a first resistance by applying a first known electrical current flowing between a first pair of connection areas through a first pad metal layer portion being the part of the patterned pad metal layer, through a first metallization layer being the part of the patterned under-bump metallization layer, and via a first common contact area between the first metallization layer portion and the first pad metal layer portion and measuring a first voltage across the first common contact area.

Preferably, the first voltage is measured over a second pair of connection areas that is distinct from the first pair of connection areas and wherein the connection areas in said second pair are mutually connected through the first pad metal layer portion, the first metallization layer portion, and the first common contact area. By using this method, for example with the help of a four-point Kelvin measurement, a contact resistance over the common contact area can be determined with relatively high accuracy.

BRIEF DESCRIPTION OF THE DRAWINGS

The invention will now be described in more detail, in a non-restrictive way, with reference to the accompanying drawings, in which.

DETAIL DESCRIPTION OF THE EMBODIMENTS

Figure 1:
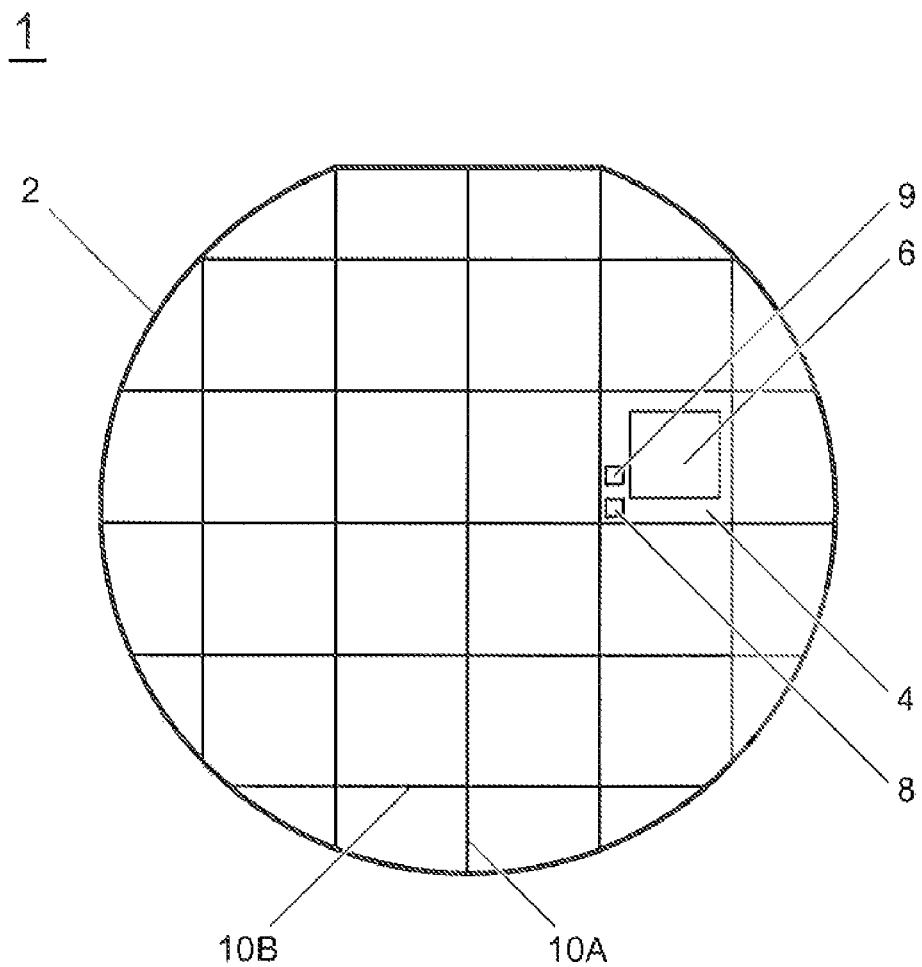
FIG. 1 shows a semiconductor wafer in a preferred embodiment of a semiconductor wafer according to the invention.

FIG. 1 shows a semiconductor wafer 1 in a preferred embodiment of a semiconductor wafer according to the invention. The semiconductor wafer 1 includes a substrate 2 made of a semiconducting material such as silicon, and includes a semiconductor device 4 according to the invention. The semiconductor device 4 preferably includes an integrated circuit 6, and a test structure 8. Preferably, the semiconductor device also includes an additional test structure 9. In this example the test structure –8 is electrically separated from the integrated circuit 6. Alternatively the test structure 8 may be electrically connected with the integrated circuit 6, for example by sharing a connection area (not drawn but for example drawn in FIG. 2 and referred to with reference numbers 14 and 16). The semiconductor wafer can be broken or sawed along lines 10A and 10B to separate the individual semiconductor devices 4 from each other. The semiconductor device 4 can be assembled in a product according to the invention.

Figure 2:
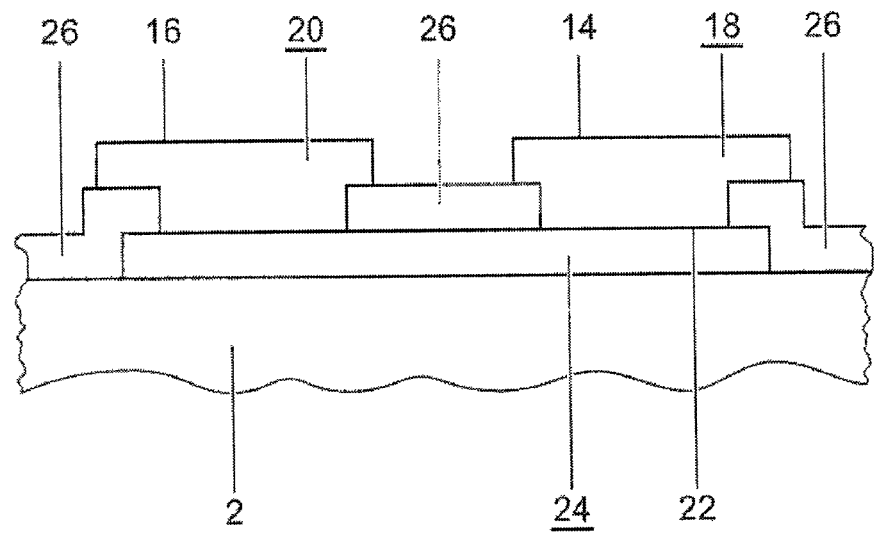
FIG. 2 shows a schematic cross-sectional view of the test structure and the substrate in an embodiment of a semiconductor device according to the invention.

FIG. 2 shows a schematic cross-sectional view of a basic test structure 11, being an example of the test structure 8, and the substrate 2, in an embodiment of the semiconductor device 4 according to the invention. The basic test structure 11 in this embodiment includes a first connection area 14 and a second connection area 16, that in use can be contacted from outside of the wafer by for example probes of a voltmeter or a current meter. For example after measurements using the basic test structure 11 are completed, the first and second connection area may be covered by for example a solder bump layer or an isolating layer. The first and second connection area 14 and 16 are formed on a top surface of respectively a first metallization layer portion 18 and a second metallization layer portion 20.

Alternatively, the second connection area 16 can also be formed for example on a top surface of the pad metal layer portion 24 outside the common contact area 22. The first and a second connection area are electrically connected with each other via a first conductive path, in this example consisting of the pad metal layer portion 24 and the first and second metallization layer portion 18 and 20, which first conductive path extends substantially via the common contact area 22. The basic test structure 11 is further provided with a third and a fourth connection area that in this example coincide with respectively the first and second connection area 14 and 16 and are connected with each other substantially via a second conductive path that extends via the common contact area 22 and in this example coincides with the first conductive path.

The first conductive path should extend substantially via the common contact area 22. In other words a test current flowing via the first conductive path delivered by a test source applied to the first and second connection area should substantially flow via the common contact area 22, although in practice a portion of the test current may leak away via parasitic paths. Preferably a portion of at least 50% of the current delivered by the test source should flow via the common contact area 22 if the patterned pad metal layer and the patterned under bump metallization layer are properly adhered to each other in the common contact area. More preferably this portion should be greater than 75%. The current path should not extend outside the patterned pad metal layer and the patterned under-bump metallization layer. In particular the presence of circuitry elements in the current path would disturb a correct assessment of the quality of the adhesion of the layers in the common contact area. Upon application of a current between the first and second connection area 14 and 16 a voltage drop between the first and second connection area occurs that is representative for a voltage drop over the common contact area 22. For example, the voltage drop over the common contact area 22 influences the voltage drop between the first and second connection area 14 and 16 to a measurable extent. For example more than 1% of the voltage drop between the first and second connection area 14 and 16 is due to the voltage drop over the common contact area 22, or for example more than 10% of the voltage drop between the first and second connection area 14 and 16 is due to the voltage drop over the common contact area 22. If relatively sensitive measurement equipment is used, also 1% or less than 1% of the voltage drop between the first and second connection area 14 and 16 may be due to the voltage drop over the common contact area 22.

The basic test structure 11 in this example also includes an isolation layer portion 26, which defines the size of the common contact area 22 and prevents an electrical current flowing from the first connection area 14 to the second connection area 16 without passing the common contact area 22. The isolation layer portion 26 can for example be made out of silicon-nitride (SiN) or silicon-oxide (SiO), for example deposited by plasma-enhanced chemical vapour deposition, or an organic material.

The pad metal layer portion 24 for example has a thickness in a range from 0.1 to 2 micrometer, for example 1 micrometer. It can include a number of different metal layers, such as for example copper layers and aluminium layers. The first and second metallization layer portion 18 and 20 have a thickness preferably between 3 and 5 micrometer and preferably include a relatively thin gold coating at its top surface, the thin gold coating for example having a thickness of several tens of nanometers. This gold coating is arranged to substantially prevent oxidation of nickel, which constitutes the bulk of the first and second metallization layer portion 18 and 20 in this example.

The first and second metallization layer portion 18 and 20 are part of a patterned under-bump metallization layer (not shown) that extends substantially over the semiconductor wafer 2. Analogously, the pad metal layer portion 24 is part of a patterned pad metal layer, and the isolation layer portion 26 is part of a patterned isolation layer. These patterned layers in general include a number of layer portions that are for example included by the integrated circuits 6. One or more of these patterned layers can for example be of uniform thickness. The patterned under-bump metallization layer is preferably deposited using electroless deposition of nickel and immersion deposition of gold. Prior to electroless nickel deposition, the patterned pad metal layer is cleaned and activated. During activation a thin metal layer is deposited, that is substantially removed during the electroless nickel deposition. The thin metal layer can for example be a zinc layer, being deposited on top of an aluminium top layer of the pad metal layer portion 24 during a zincate treatment.

Alternatively, the thin metal layer can for example be a palladium layer, being deposited on top of a copper top layer of the pad metal layer portion 24 during a palladium treatment. Such an activation treatment is well known to those skilled in the art and a further description is deemed superfluous.

Alternatively or additionally, electroplating, or blanket deposition of a metal of a metallization layer followed by photolithographic patterning of a resist layer and etching can be used to obtain the patterned under-bump metallization layer. The patterned pad metal layer is preferably obtained by blanket deposition of metals by for example sputtering, and/or one or more other vacuum techniques, followed by photolithographic patterning of a resist layer and etching. Similar techniques can be used for obtaining the patterned isolation layer.

Alternatively or additionally, spin-coating can be used as blanket deposition technique.

Alternatively, one or more of the patterned pad metal layer, the patterned under-bump metallization layer, and the patterned isolation layer may be deposited directly in a patterned way by using printing techniques, such as ink-jet printing.

The previously mentioned deposition- and patterning techniques are well known to the person skilled in the art and a further description of these is deemed superfluous.

The first and second metallization layer portion 18 and 20 can include an electroless-deposited nickel layer portion. Alternatively the first and second metallization layer portion 18 and 20 can include a thin sputtered titanium layer portion, a thin sputtered copper layer portion, and a nickel layer portion obtained by electroplating. Alternatively, the first and second metallization layer portion 18 and 20 can include a sputtered layer portion of titanium or copper and a sputtered nickel-vanadium layer portion.

The basic test structure 11 in FIG. 2 can be used in a possible method according to the invention. In this possible method, a resistance is determined between the first connection area 14 and the second connection area 16 by connecting measurement probes with the first and second connection area, the probes being connected with a measuring apparatus that for example determines electrical resistance between the probes from a measured current and voltage. The determined resistance will be dependent on a layer resistance inside the metallization layer portions 18 and 20 and the pad metal layer portion 24, and a contact resistance of the common contact area 22 and of a common contact area similar to the common contact area 22 that is common between the second metallization layer portion 20 and the pad metal layer portion 24 and will form a contact resistance having a specific contact resistance similar to the common contact area 22. The layer resistance inside relevant layer portions, in this case the layer resistance inside the first and second metallization layer portion 18 and 20 and the layer resistance inside the pad metal layer portion 24, can be determined independently from the determined resistance. This can for example be done by using predetermined values for the bulk resistance of the materials of the relevant layer portions, measuring the thickness of the relevant layer portions and using a planar geometry of the relevant layer portions. The planar geometry of the relevant layer portions is visible for example in a top view of the relevant layer portions. Such measurement methods are clear to the person skilled in the art and a further description is deemed superfluous. By subtracting the layer resistances in the relevant layer portions from the determined resistance, a value of the contact resistance of the common contact area 22 can be determined. By comparing this value with a predetermined value, the adhesion between the patterned under-bump metallization layer and the patterned pad metal layer can be assessed, at least for a part of the semiconductor wafer near the basic test structure 11. The predetermined value is for example equal to an expected contact resistance in case of proper adhesion between the patterned under-bump metallization layer and the patterned pad metal layer. For example, if the value of the determined contact resistance is more than x times larger than the predetermined value, the adhesion of the patterned under-bump metallization layer is regarded as being insufficient for the relevant part of the semiconductor wafer and one or more of the semiconductor devices on that part of the semiconductor wafer can be disposed, or alternatively the patterned under-bump metallization layer is regarded as being insufficient for the whole semiconductor wafer and the whole semiconductor wafer can be disposed. Depending on the required quality of the adhesion, the value of x is selected from a range of for example 2 to 10, for example x=3 can be used in practice.

Figure 3:
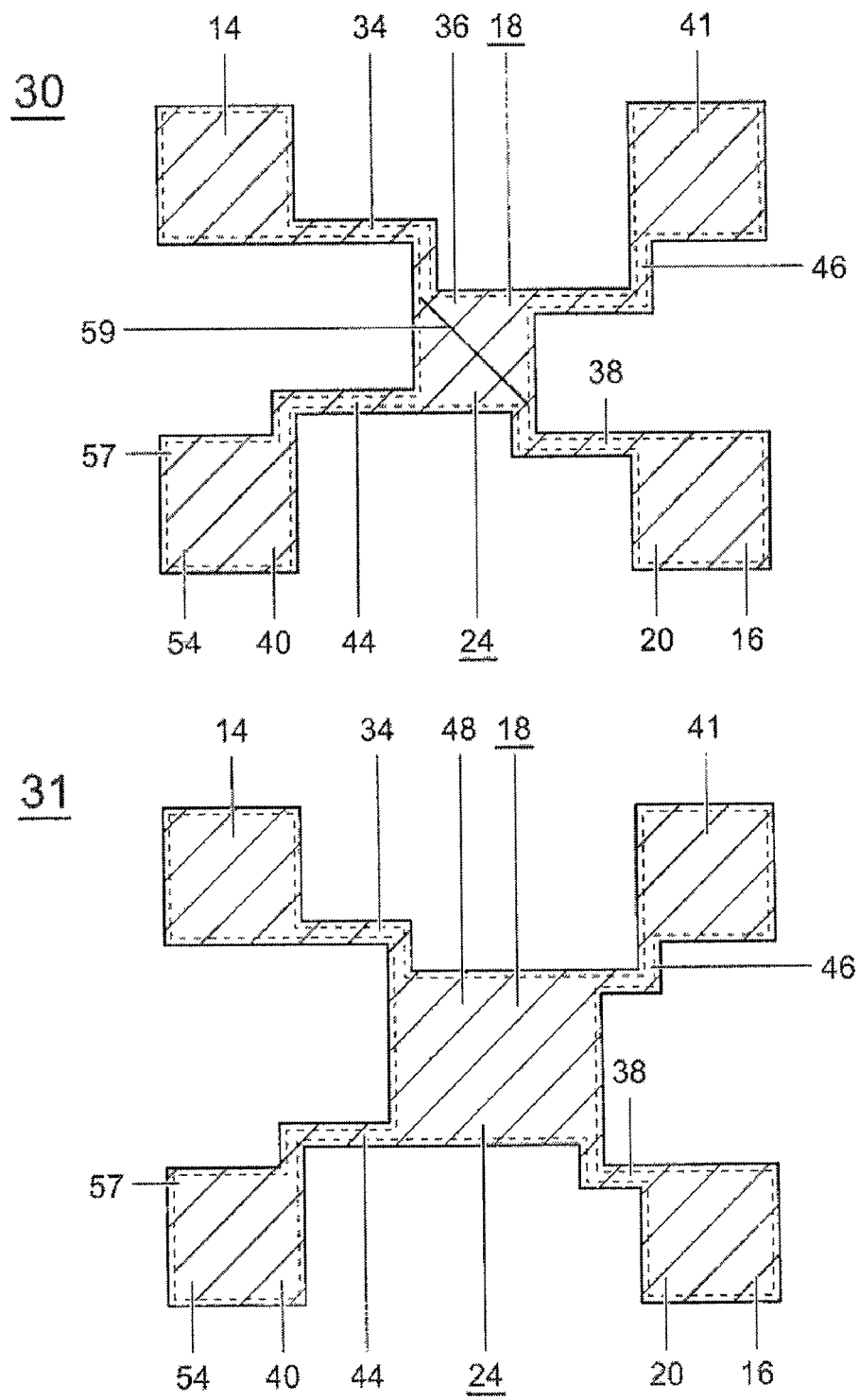
FIG. 3 shows a top view of a first test structure and a second test structure, in an alternative embodiment of a semiconductor device according to the invention.

FIG. 3 shows a top view of a first test structure 30 and a second test structure 31, being another example of the test structure 8 and an example of the additional test structure 9, in an alternative embodiment of the semiconductor device 4 according to the invention. It is clear that the first and second test structure 30 and 31 are examples and that many other test structures can be included by the semiconductor device 4 according to the invention. FIG. 3 shows a planar geometry of the first and second test structure. A schematic cross-section of the first test structure 30 and the second test structure 31 is similar to FIG. 2, and the same index numbers and names will be used to described similar parts.

The first test structure 30 includes a first pair of connection areas consisting of the first and second connection area 14 and 16. The first pair of connection areas are mutually connected via a first lead 34, a first common contact area 36 being similar to the common contact area 22 in FIG. 2, and a second lead 38. The first test structure further includes a second pair of connection areas, consisting of a third and a fourth connection area 40 and 41. These are connected with each other through a third lead 44, the first common contact area 36, and a fourth lead 46.

The first one of the first pair of connection areas is formed on the first metallization layer portion 18, that extends via the first lead 34 to the first common contact area 36. The first metallization layer portion 18 forms a top part of the first lead 34 and the first common contact area 36. The first metallization layer portion 18 in FIG. 3 further extends via the fourth lead 46 to the fourth connection area 41. The second connection area 16 is formed on the second metallization layer portion 20. The third connection area 40 is formed on a top surface of a third metallization layer portion 54. The pad metal layer portion 24 is partly covered by and is substantially present below the metallization layer portion 18 and the second and third metallization layer portion 20 and 54. A circumference of the pad metal layer portion 24 is indicated by the dashed line 57. The second and third lead 38 and 44 are part of the pad metal layer portion 24, and can be covered by an isolation layer portion similar to the isolation layer portion 26 in FIG. 2. The first, second and third metallization layer portion 18, 20, and 54 are part of the patterned under-bump metallization layer. The pad metal layer portion 24 is part of the patterned pad metal layer.

The isolation layer portion in FIG. 3 is part of the patterned isolation layer.

The first and a second connection area 14 and 16 are electrically connected with each other via the first conductive path that extends substantially via the first common contact area 36. The third and a fourth connection area 40 and 41 are electrically connected with each other substantially via the second conductive path that extends via the first common contact area 36. The first and second connection area 14 and 16 are distinct from the third and fourth connection area 40 and 41. Upon application of a current between the first and second connection area 14 and 16 a voltage drop between the third and fourth connection area 40 and 41 occurs that is representative for a voltage drop over the first common contact area 36. For example, the voltage drop over the first common contact area 36 influences the voltage drop between the third and fourth connection area 40 and 41 to a measurable extent.

For example more than 1% of the voltage drop between the third and fourth connection area 40 and 41 is due to the voltage drop over the first common contact area 36, or for example more than 10% of the voltage drop between the third and fourth connection area 40 and 41 is due to the voltage drop over the first common contact area 36.

If relatively sensitive measurement equipment is used, also 1% or less than 1% of the voltage drop between the first and second connection area 14 and 16 may be due to the voltage drop over the common contact area 22.

The second test structure 31 is defined similarly as the first test structure 30 and is of similar set-up, but the size of its second common contact area 48 is substantially different from the size of the first common contact area 36. The second common contact area 48 is for example four times as large as the first common contact area 36.

For example, a distance and direction from the first connection area 14 to the second connection area 16 of the first test structure 30 is substantially equal, for example within 1% difference, or for example within 10% difference, to a distance and direction from the first connection area 14 to the second connection area 16 of the second test structure 31.

As another example, a distance and direction from the third connection area 40 to the fourth connection area 41 of the first test structure 30 is substantially equal, for example within 1% difference, or for example within 10% difference, to a distance and direction from the third connection area 40 to the fourth connection area 41 of the second test structure 31.

The first test structure 30 can be used in a preferred method according to the invention. In use of the first test structure 30 according to this preferred method, a known current is applied via the first pair of connection areas. When the known current is applied, a first voltage is measured between the second pair of connection areas using a voltmeter with probes that are connected with the second pair of connection areas. The first voltage is substantially independent from for example electrical layer resistance inside the third and fourth lead 44 and 46 and contact resistance between the probes and the second pair of connection areas. A first resistance determined from the known current and the measured first voltage, can be substantially determined by the contact resistance in the first common contact area and is also determined by electrical layer resistance inside parts of the pad metal layer portion 24 and the metallization layer portion 18 that are connected via the first common contact area 36 and that in use conduct a significant part of the applied known current.

In a first approximation, from the known current I and the measured first voltage $\Delta V$, a contact resistance $A_{rc} = \Delta V/I$ can be determined. By using the size A of the first common contact area 36, a specific contact resistance $R_s = R_c \cdot A$ can be determined as well.

The contact resistance $R_c$, can be compared with the predetermined value for assessing the adhesion of the patterned under-bump metallization layer. Similarly, the specific contact resistance can be compared with another predetermined value, for example being equal to an expected specific contact resistance in case of proper adhesion between the patterned under-bump metallization layer and the patterned pad metal layer. Additionally, more test structures similar to the first test structure 30, with mutually varying size of the common contact area, may be used in a similar way. An average value of the contact resistance can then be obtained by plotting the reciprocal of the varying size versus the corresponding contact resistance, and using regression techniques.

In a possibly more accurate method, the electrical layer resistance inside parts of the pad metal layer portion 24 and the first metallization layer portion 18 that are connected via the first common contact area 36 and that in use conduct a significant part of the known current, can be determined and subtracted from the first resistance. This determination can for example be performed by using known values for the electrical bulk resistance of materials in the pad metal layer portion 24 and the first metallization layer portion 18, by using the planar geometry of the first test structure 30, and by measuring a layer thickness of the pad metal layer portion 24 and the first metallization layer portion 18.

Alternatively or additionally, this determination can for example be performed by combining the first resistance with a similarly determined second resistance using the second test structure 31. In a first mathematical relation, the ratio of the contact resistance in the first common contact area 36 and the second common contact area 48 can be expected to equal the ratio of the size of the second common contact area and the first common contact area. Similarly, in a second mathematical relation the electrical layer resistance inside parts of the pad metal layer portion 24 and the first metallization layer portion 18 that are connected via the first common contact area 36 and that in use conduct a significant part of the known current, and the electrical layer resistance inside parts of the pad metal layer portion 24 and the first metallization layer portion 18 that are connected via the second common contact area 48 and that in use conduct a significant part of the known current, are related. Such a second mathematical relation can be inferred from the size and planar geometry of the first and second common contact area 36 and 48, and a layer thickness of the pad metal layer portions 24 and the metallization layer portions 18, using conventional theory of electromagnetism. Ways to derive such a second mathematical relationship are clear to the person skilled in the art. By using the first and/or second mathematical relation when combining the first resistance with the second resistance, a relatively accurate value of the contact resistance can be determined. For example, the planar geometry of the first and second common contact area 36 and 48 including the adjacent parts of the first, second, third, and fourth leads 34, 38, 44, and 46 have a similar shape, that is dimensions of their planar geometry vary only by a numerical scale factor.

A typical dimension for the first and second pair of connection areas is for example around 200 micrometer. In another example, each connection area of the first and second pair of connection areas has a circular shape with a diameter of 280 micrometer. A dimension of the first and second common area is typically around 300 micrometer.

However, the dimension of the first and second common contact area can also be larger or smaller, for example around 50 micrometer, or for example around 5 micrometer. Preferably, the size of the first and second common contact area is such that the contact resistance of the common contact areas can be determined accurately.

A first imaginary straight line 59, positioned within the first common contact area 36, from the first lead 34 connecting the first common contact area 36 with the first connection area 14 to the second lead 38 connecting the second connection area 16 with the first common contact area 36, has a length that is substantially equal to a length of a second imaginary straight line of maximal length within the first common contact area 36. This has the advantage that the known current is relatively evenly distributed over the common contact area 36.

Figure 4:
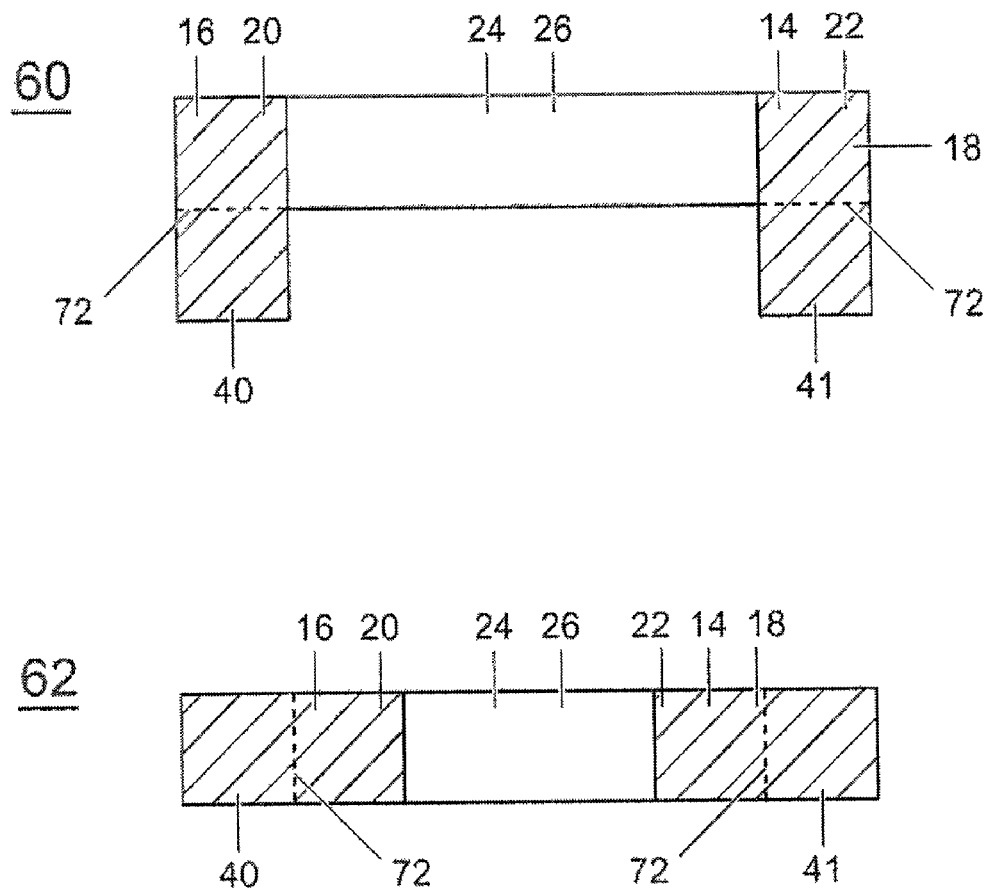
FIG. 4 shows a top view of a third test structure and a fourth test structure, in another embodiment of a semiconductor device according to the invention.

FIG. 4 shows a top view of a third test structure 60 and a fourth test structure 62, being yet another example of the test structure 8 and the additional test structure 9, in another embodiment of the semiconductor device 4 according to the invention. FIG. 4 shows a planar geometry of the third and fourth test structure. A schematic cross-section of the third test structure 60 and the fourth test structure 62 is similar to FIG. 2, and the same index numbers and names will be used to describe similar parts. Parts being similar to those in FIG. 3 will be described by the same index numbers and names. The third test structure 60 includes the first and second connection area 14 and 16. These are mutually connected through the first and second metallization layer portion 18 and 20, and the pad metal layer 24, via the common contact area 22. The pad metal layer portion 24 is covered by the resist layer portion 26. The third test structure is provided with the third and fourth connection area 40 and 41, being formed respectively on a top surface of the first metallization layer portion 18 and a second metallization layer portion 20. A distance and direction from the third to the fourth connection area of the third test structure 60 is equal to a distance and direction from the third to the fourth connection area of the fourth test structure 62. Dashed lines 72 each indicate a border of the connection areas 14, 16, 40, 41.

The third and fourth test structure 60 and 62 are defined similarly to each other. The first conductive path, which in this example consist of the pad metal layer 24 and the first and second metallization layer 18 and 20, has a substantially different geometry in the fourth test structure 62 compared to the third test structure 60, as a result of which an electrical layer resistance between the third and the fourth connection area 40 and 41 is substantially different in the fourth test structure 62 compared to the third test structure 60.

The third and fourth test structure can be used according to another possible method according to the invention. In this other possible method, the geometry of the first conductive path between the first and second connection area 14 and 16 of the third test structure 60 is substantially different from the geometry of the first conductive path between the first and second connection area 14 and 16 of the fourth test structure 62. As a result, an electrical layer resistance between the first and second connection area of the third test structure 60, in this case a layer resistance inside the pad metal layer portion 24, contributing to the first voltage is substantially different from an electrical layer resistance between the first and second connection area 14 and 16 of the fourth test structure 62, in this case a layer resistance inside the pad metal layer portion 24, contributing to a second voltage measured between the third and fourth connection area 40 and 41 of the fourth test structure 62.

A resistance determined between the first and second connection area in FIG. 4 in first order equals the sum of the layer resistance inside the pad metal layer portion 24, the contact resistance of the common contact area 22 between the first metallization layer portion 18 and the pad metal layer portion 24, and the similar contact resistance between the pad metal layer portion 24 and the second metallization layer portion 20. In the third and fourth test structure, the layer resistance inside the pad metal layer portion 24 is proportional to a distance between the first and second metallization layer portion 18 and 20, and a ratio of the layer resistance inside the pad metal layer 24 in the third test structure and the layer resistance inside the pad metal layer 24 in the fourth test structure equals the ratio of the distance between the first and second metallization layer portion in the first test structure and the distance between the first and second metallization layer portion in the second test structure, which ratio is taken to equal a factor. According to a third mathematical relation, the contact resistance $R_c$ of the common contact area between the first metallization layer portion 18 and the pad metal layer portion 24 is approximately equal to $2R_c=(R_1-R_2)/(1-)+R_2$, where $R_1$ is the resistance determined between the first and second connection area 14 and 16 of the third test structure 60, and $R_2$ is the resistance determined between the first and second connection area of the fourth test structure 62.

Figure 5:
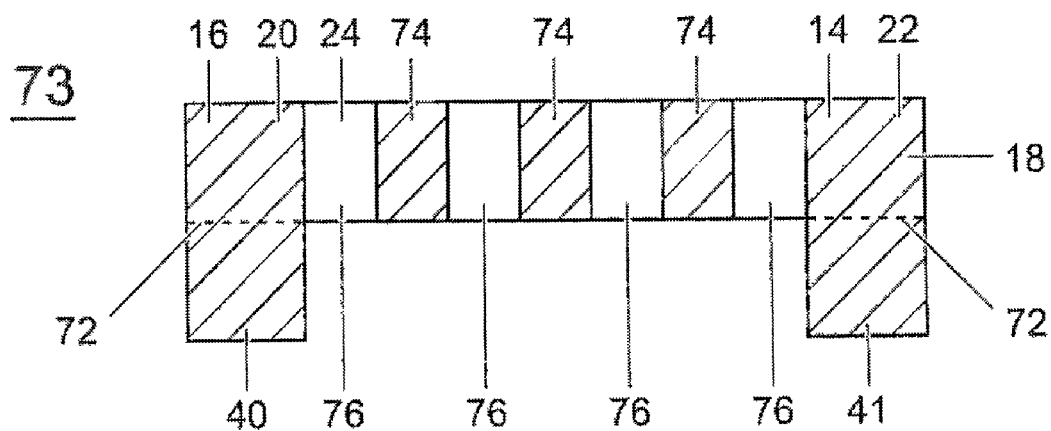
FIG. 5 shows a fifth test structure, provided with additional metallization layer portions.

FIG. 5 shows a fifth test structure 73, provided with additional metallization layer portions 74. These are separated by isolator layer portions 76, being similar to the isolator layer portion 26 in FIG. 2. The fifth test structure is defined similarly as the third test structure 60 and has an equal distance between the first and the second connection area 14 and 16, and also between the third and fourth connection area 40 and 41, but has a substantially different geometry of the first conductive path between the first and second connection area 14 and 16, and also of the second conductive path between the third and fourth connection area 40 and 41, compared to the third test structure. As a result, an electrical layer resistance between the third and the fourth connection area is substantially different in the fifth test structure 73 compared to the third test structure 60.

The semiconductor device may be provided with a number of different test structures 73, each having a similar planar geometry only differing in the number of additional metallization layer portions 74. The number of metallization portions 74 can for example be plotted versus the corresponding resistance determined between the third and the fourth connection area 40 and 41. By using regression techniques, a relation between the two can be obtained which can be used in determining a value for the specific contact resistance.

The third and fourth connection area 40 and 41 may be positioned at another position as well, as long as a voltage measured over the third and fourth connection area is determined to a measurable extent by a voltage drop over contact surfaces between the pad metal layer 24 and either the metallization layer portions 74 or the first and second metallization layer 18 and 20. For example, the third and fourth connection area may be positioned to measure a voltage directly over a part of the pad metal layer portion 24 that is provided with the additional metallization layer portions 74. This is especially relevant when a layer resistance inside a part of the pad metal layer 24 that is covered by a metallization layer portion 74 is much larger, for example more than five times larger, then a layer resistance inside the metallization layer portion 74. In this case, one or more contact surfaces between the pad metal layer 24 and the metallization layer portions 74 form a common contact area.

It is thus believed that the operation and construction of the invention will be apparent from the foregoing description. The invention is not limited to any embodiment herein described and, within the purview of the skilled person, modifications are possible which should be considered within the scope of the appended claims. Equally all kinematic inversions are considered inherently disclosed and to be within the scope of the invention.

The use of expressions like: "in particular", "typical", "preferred", "more preferred" etc. is not intended to limit the invention. Features which are not specifically or explicitly described or claimed may be additionally included in the structure according to the invention without deviating from its scope.

The invention claimed is:

1. A semiconductor device having a patterned pad metal layer and a patterned under-bump metallization layer on said patterned pad metal layer and being mutually electrically connected therewith in a first common contact area, the semiconductor device comprising:

a first test structure for determining a contact resistance between the patterned metallization layer and the patterned pad metal layer in the first common contact area between the patterned metallization layer and the patterned pad metal layer, the first test structure including:

a pad metal layer portion being part of the patterned pad metal layer;

a first metallization layer portion being part of the patterned under-bump metallization layer and being electrically connected to the pad metal layer portion through the first common contact area, said metallization layer portion comprising a top surface including a first connection area defining a first external contact of the first test structure, a second connection area defining a second external contact of the first test structure, said second connection area being comprised in the patterned metallization layer or the patterned pad metal layer outside the first common contact area, the first and second connection areas being electrically connected with each other via a first conductive path that extends through the metallization layer portion and the pad metal layer portion, via the first common contact area, wherein the patterned under-bump metallization layer further comprises a second metallization portion and a third metallization portion, said pad metal layer portion being partially covered by and present below the first, second and third metallization portions, wherein:

the second contact area is formed on a top surface of the second metallization portion;

the first test structure further includes a third connection area formed on a top surface of the third metallization portion and a fourth connection area formed on the top surface of the first metallization portion;

the first conductive path comprises a first lead extending from the first connection area to the first common contact area and a second lead extending from the first common contact area to the second connection area, the first metallization layer portion comprising the first lead and the pad metal layer comprising the second lead;

said third and fourth connection areas are electrically connected with each other via a second conductive path comprising a third lead extending from the third connection area to the first common contact area and a fourth lead extending from the first common contact area to the fourth connection area, the pad metal layer comprising the third lead and the first metallization layer portion comprising the fourth lead, wherein the conductive coupling between the first conductive path and the second conductive path facilitates the measurement of a voltage drop between the third and fourth connection area that is representative for a voltage drop over the first common contact area upon the application of a current between the first and second connection area;

a second test structure having the same shape as the first test structure and having a second common contact area that is different in size from the first common contact area, wherein the first common contact area and the second common contact area have a similar shape in which dimensions of their planar geometry vary only by a numerical scale factor.

2. The semiconductor device according to claim 1, wherein a first imaginary straight line, positioned within the first common contact area, from the first lead connecting the first common contact area with the first connection area to the second lead connecting the second connection area with the first common contact area, has a length that is equal to a length of a second imaginary straight line of maximal length within the first common contact area.

3. The semiconductor device according to claim 1, wherein second common contact area is four times as large as the first common contact area.

4. A semiconductor wafer being provided with a semiconductor device according to claim 1.

5. A product including a semiconductor device according to claim 1.

6. A method for assessing adhesion of a patterned under-bump metallization layer on a patterned pad metal layer of a semiconductor wafer, the method including electrically determining a contact resistance between a part of the patterned under-bump metallization layer and a part of the patterned pad metal layer, and examining whether the determined contact resistance exceeds a predetermined value, the electrically determining comprising:

determining a first resistance by applying a first known electrical current flowing between a first pair of connection areas defining respective external contacts through a first pad metal layer portion being the part of the patterned pad metal layer, through a first metallization layer portion being the part of the patterned under-bump metallization layer and comprising one of said first pair of connection areas on its top surface, and via a first common contact area between the first metallization layer portion and the first pad metal layer portion and measuring a first voltage over the first common contact area;

determining a second resistance in a similar way as determining the first resistance by applying a second known electrical current flowing between a third pair of connection areas defining respective external contacts through a second pad metal layer portion being part of the patterned pad metal layer, a second metallization layer portion being part of the patterned under-bump metallization layer and comprising one of said third pair of connection areas on its top surface, and a second common contact area between the second metallization layer portion and the second pad metal layer portion, the first common contact area and the second common contact area having a similar shape in which dimensions of their planar geometry vary only by a numerical scale factor;

measuring a second voltage over the second common contact area; and determining the contact resistance from the first and the second resistance;

wherein a geometry of a conductive path between the first pair of connection areas via the first common contact area is different from a geometry of a conductive path between the third pair of connection areas via the second common contact area, so that an electrical layer resistance between the first pair of connection areas contributing to the first voltage is different from an electrical layer resistance between the third pair of connection areas contributing to the second voltage.

7. The method according to claim 6, wherein the first voltage is measured over a second pair of connection areas that is distinct from the first pair of connection areas and wherein the connection areas in said second pair are mutually connected through the first pad metal layer portion, the first metallization layer portion, and the first common contact area.

8. The method according to claim 6, wherein second common contact area is four times as large as the first common contact area.

9. The method according to claim 6, wherein the patterned under-bump metallization layer is deposited using electroless deposition.

10. The method according to claim 6, wherein the patterned pad metal layer is activated by an activation treatment.

11. The method according to claim 6, wherein the method includes conducting a shear test using a monitor wafer.

12. The method according to claim 6, wherein the semiconductor wafer is a semiconductor wafer according to claim 4.

* * * * *